(12) United States Patent
Heo

(10) Patent No.: US 9,865,658 B2
(45) Date of Patent: Jan. 9, 2018

(54) ORGANIC LIGHT-EMITTING DISPLAY APPARATUS

(71) Applicant: SAMSUNG DISPLAY CO., LTD., Yongin-si, Gyeonggi-do (KR)

(72) Inventor: Seong Kweon Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 14/957,448

(22) Filed: Dec. 2, 2015

(65) Prior Publication Data
US 2016/0226030 A1    Aug. 4, 2016

(30) Foreign Application Priority Data

Feb. 2, 2015  (KR) ......................... 10-2015-0016291

(51) Int. Cl.
*H01L 27/32* (2006.01)
*H01L 51/52* (2006.01)

(52) U.S. Cl.
CPC ........ *H01L 27/322* (2013.01); *H01L 27/3269* (2013.01); *H01L 51/5271* (2013.01); *H01L 51/5281* (2013.01); *H01L 51/5284* (2013.01); *H01L 2251/5315* (2013.01)

(58) Field of Classification Search
CPC ............... H01L 27/322; H01L 27/3269; H01L 51/5284; H01L 51/5271; H01L 51/5281
See application file for complete search history.

(56) References Cited

U.S. PATENT DOCUMENTS

| 2008/0151161 | A1* | 6/2008 | Kim | ......................... G01J 3/51 349/116 |
| 2009/0085859 | A1* | 4/2009 | Song | ...................... G09G 3/3406 345/102 |
| 2010/0007270 | A1  | 1/2010 | Suh | |
| 2011/0204771 | A1* | 8/2011 | Lee | ...................... H01L 27/3258 313/504 |
| 2016/0020261 | A1* | 1/2016 | Kim | .................... H01L 27/3227 362/235 |

FOREIGN PATENT DOCUMENTS

| JP | 2008-145835 A | 6/2008 |
| JP | 2010-78853 A | 4/2010 |
| KR | 10-2005-0079813 A | 8/2005 |
| KR | 10-2009-0065104 A | 6/2009 |
| KR | 10-2010-0007265 A | 1/2010 |

* cited by examiner

*Primary Examiner* — Douglas Menz
(74) *Attorney, Agent, or Firm* — Lewis Roca Rothgerber Christie LLP

(57) ABSTRACT

An organic light-emitting display apparatus includes an organic light-emitting display panel having a display area including a plurality of pixel areas and a non-display area adjacent the display area; and a light sensing unit. The organic light-emitting display panel includes a first substrate including an organic light-emitting device on a first base substrate and a second substrate including a black matrix between the plurality of pixel areas on a surface of a second base substrate facing the first substrate and a reflective pattern formed on the black matrix. The light sensing unit is at one side of the organic light-emitting display panel.

27 Claims, 8 Drawing Sheets

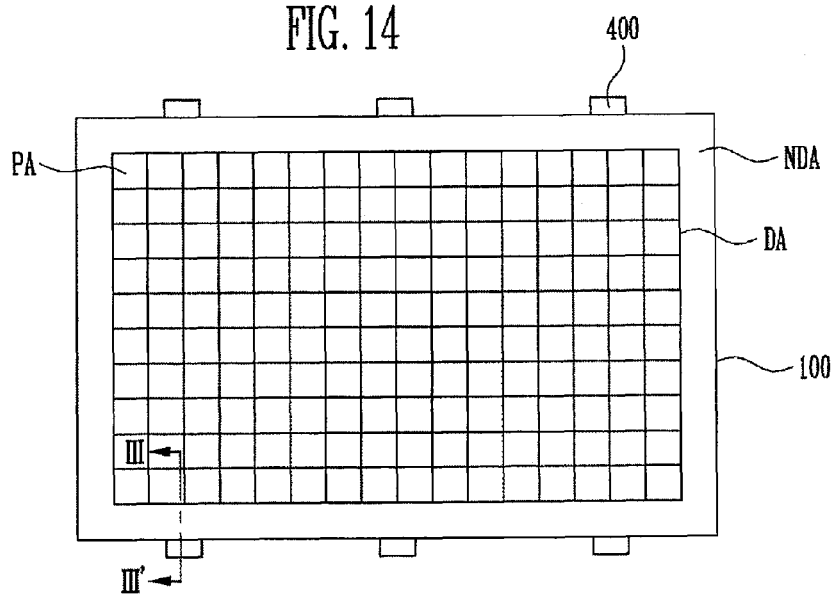
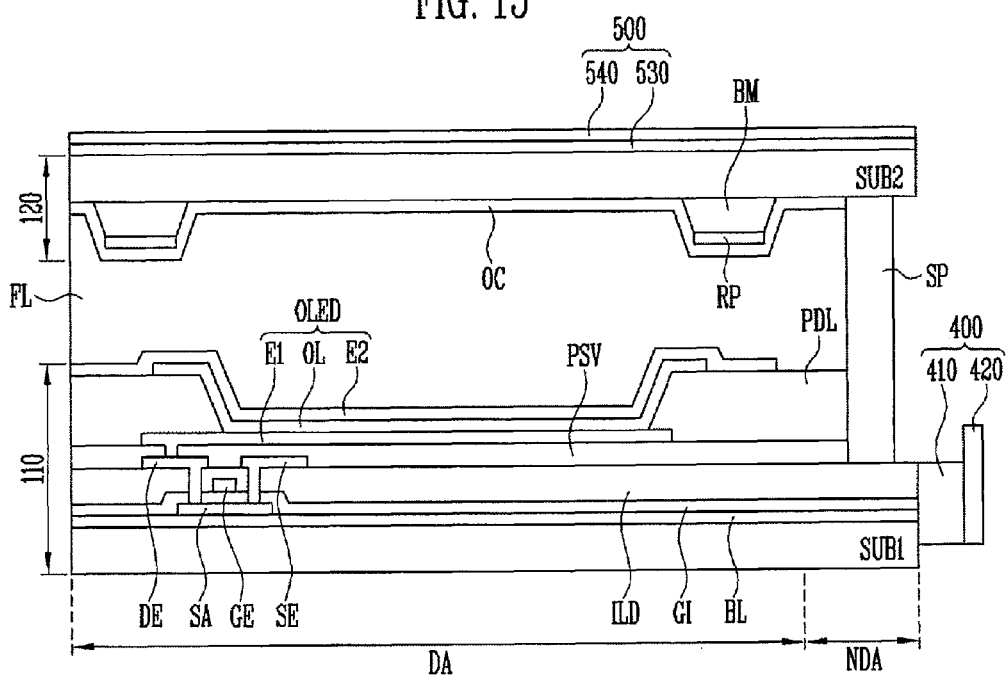

ORGANIC LIGHT-EMITTING DISPLAY APPARATUS

CROSS-REFERENCE TO RELATED APPLICATION

This application claims priority to and the benefit of Korean Patent Application No. 10-2015-0016291, filed on Feb. 2, 2015 in the Korean Intellectual Property Office, the contents of which are incorporated herein by reference in their entirety.

BACKGROUND

1. Field

Embodiments of the present invention relate to an organic light-emitting display apparatus.

2. Description of the Related Art

Various types of flat panel display apparatuses are currently being manufactured and used. Among these flat panel display apparatuses, an organic light-emitting display apparatus including organic light-emitting devices (e.g., organic light-emitting diodes) displays an image by using the organic light-emitting devices to generate light due to the recombination of electrons and holes. The organic light-emitting display apparatus has a high response speed and can be driven with low power consumption.

The organic light-emitting device may deteriorate while in use, and the amount of light generated by the organic light-emitting device may be reduced due to such deterioration. As a result, luminance of the organic light-emitting display apparatus may be reduced. When the luminance of light emitted from the organic light-emitting display apparatus is measured and determined to be less than a reference luminance, a compensation circuit may be used to compensate for the reduction in luminance of the organic light-emitting display apparatus.

SUMMARY

Embodiments of the present invention are directed toward an organic light-emitting display apparatus capable of compensating (e.g., configured to compensate) for luminance reduction.

According to an embodiment of the present invention, there is provided an organic light-emitting display apparatus including an organic light-emitting display panel having a display area and a non-display area, the display area including a plurality of pixel areas, the non-display being adjacent the display area, and a light sensing unit at one side of the organic light-emitting display panel, wherein the organic light-emitting display panel includes: a first substrate including an organic light-emitting device on a first base substrate, and a second substrate including a black matrix between the plurality of pixel areas at a side of a second base substrate facing the first substrate and a reflective pattern formed on the black matrix.

The organic light-emitting device may be a top emission type organic light-emitting device.

The black matrix may include at least one of a protruding portion protruding in a direction toward the first substrate and a recessed portion recessed in a direction away from the first substrate, and the reflective pattern may have a shape corresponding to the protruding portion. Each of the protruding portion and the recessed portion may have an inclined surface.

The reflective pattern may be on a portion of the black matrix that is adjacent to the non-display area.

The second substrate may include an overcoat layer on the second base substrate, and the black matrix and the reflective pattern may be between the overcoat layer and the second base substrate. The second substrate may include an overcoat layer between the black matrix and the reflective pattern and on the second base substrate.

The light sensing unit may include a photo sensor facing a side of the organic light-emitting display panel, and a sensor substrate on which the photo sensor is mounted.

The second substrate may include a plurality of color filters in spaces of the black matrix and having different colors. The organic light-emitting display device may further include an optical member on the second base substrate and arranged in a direction in which emitted light from the organic light-emitting display panel is transmitted, and the optical member may reduce reflection of external light. The optical member may include a neutral density film and an anti-reflection film on the neutral density film.

The optical member may include a polarizer having a polarizing axis, and a retardation film between the organic light-emitting display panel and the polarizer and having a phase difference of $\frac{1}{4}\lambda$.

The light sensing unit may include first, second, and third photo sensors.

According to another embodiment of the present invention, there is provided an organic light-emitting display apparatus including an organic light-emitting display panel having a display area and a non-display area adjacent the display area, the display area includes a plurality of pixel areas, the organic light-emitting display panel includes a first substrate and a second substrate facing the first substrate, and a light sensing unit including a photo sensor facing a side of the first substrate, wherein the first substrate includes a thin film transistor including a semiconductor active layer, a gate electrode, a source electrode and a drain electrode formed on a first base substrate, a gate insulating layer between the semiconductor active layer and the gate electrode, an interlayer insulating layer on the gate electrode and insulating the gate electrode, the source electrode and the drain electrode, and a top emission type organic light-emitting device coupled to the thin film transistor, wherein the second substrate includes a black matrix between the plurality of pixel areas on a second base substrate facing the first substrate, and a second substrate including a reflective pattern on the black matrix.

BRIEF DESCRIPTION OF THE DRAWINGS

Example embodiments of the present invention will now be described more fully hereinafter with reference to the accompanying drawings; however, the present invention may be embodied in different forms and should not be construed as being limited to the embodiments set forth herein. Rather, these embodiments are provided so that this disclosure will be thorough and complete, and will fully convey the scope of the present invention to those skilled in the art.

In the figures, dimensions may be exaggerated for clarity of illustration. Like reference numerals refer to like elements throughout.

FIG. 14 is a plan view of an organic light-emitting display apparatus according to another embodiment of the present invention.

FIG. 15 is a cross-sectional view taken along the line III-III' of FIG. 14.

DETAILED DESCRIPTION

Figure 1:
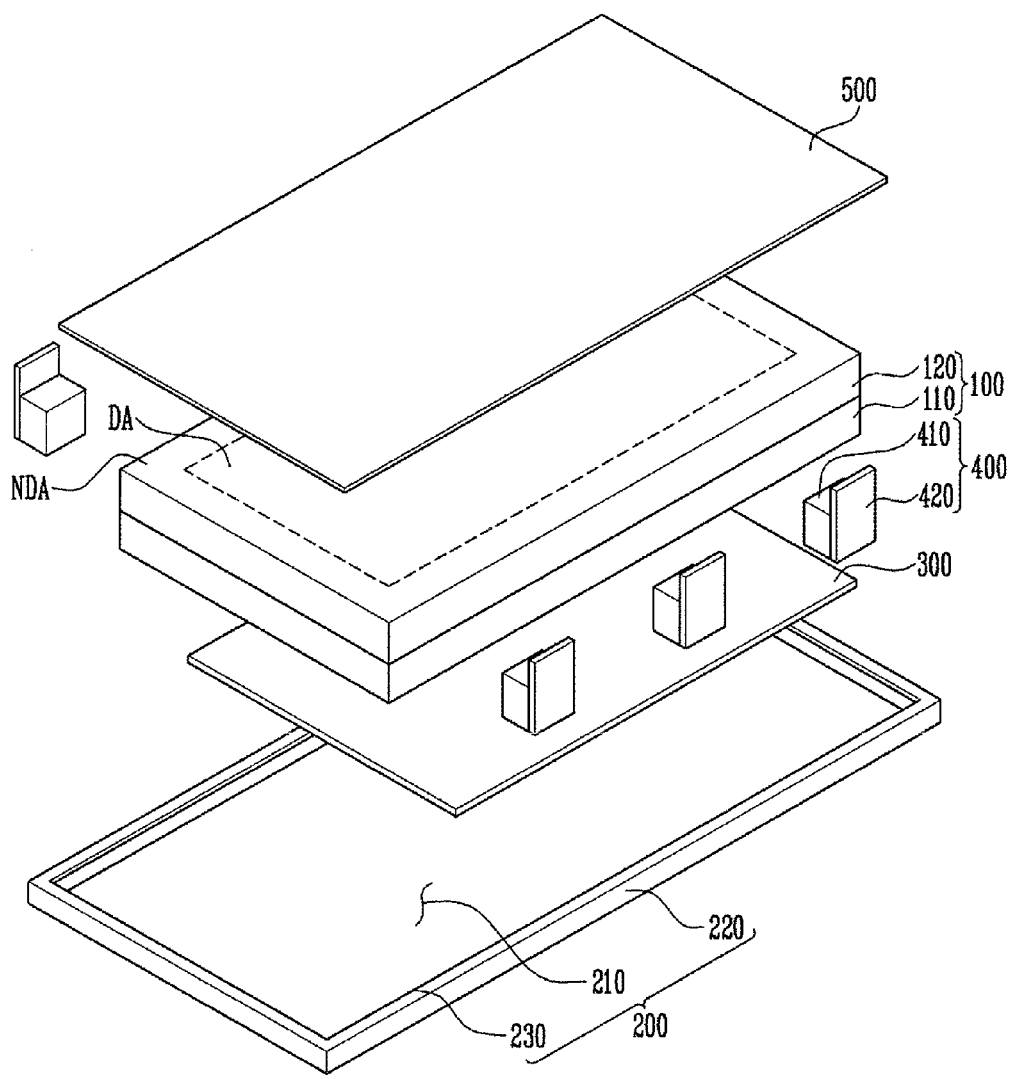
FIG. 1 is an exploded perspective view illustrating an organic light-emitting display apparatus according to an embodiment of the present invention.

Hereinafter, various examples embodiments of the present invention will be described in more detail with reference to the accompanying drawings.

It will be understood that when an element is referred to as being "between" two elements, it may be the only element between the two elements or one or more intervening elements may also be present. It will be further understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention". Expressions, such as "at least one of," when preceding a list of elements, modify the entire list of elements and do not modify the individual elements of the list. Also, the term "exemplary" is intended to refer to an example or illustration.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments only and is not intended to be limiting of example embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The driving circuit, luminance compensation circuit, and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the driving circuit and/or the luminance compensation circuit may be formed on one integrated circuit (IC) chip or on separate IC chips. Further, the various components of the driving circuit and/or the luminance compensation circuit may be implemented on a flexible printed circuit film, a tape carrier package (TCP), a printed circuit board (PCB), or formed on a same substrate as the driving circuit and/or the luminance compensation circuit. Further, the various components of the driving circuit and/or the luminance compensation circuit may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Figure 2:
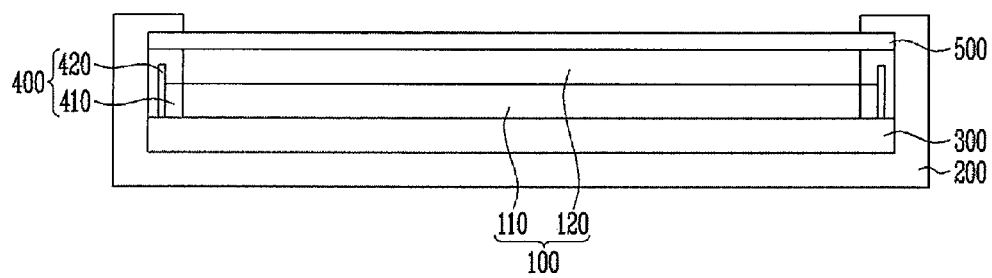
FIG. 2 is a cross-sectional view of the organic light-emitting display apparatus shown in FIG. 1.

FIG. 1 is an exploded perspective view of an organic light-emitting display apparatus according to an embodiment of the present invention. FIG. 2 is a cross-sectional view of the organic light-emitting display apparatus shown in FIG. 1.

Referring to FIGS. 1 and 2, an organic light-emitting display apparatus may include an organic light-emitting display panel 100, a housing 200, a driving circuit unit 300 (e.g., a driving circuit), a plurality of light sensing units 400 (e.g., a plurality of light sensors), and an optical member 500.

The organic light-emitting display panel 100 may include a display area DA for displaying an image and a non-display area NDA arranged adjacent to (e.g., at a periphery of) the display area DA. The display area DA may include a plurality of pixel areas PA. Light emitted from each of the pixel areas PA may have various different colors. For example, light emitted from each of the pixel areas PA may be red, green, blue, cyan, magenta, or yellow.

The organic light-emitting display panel 100 may include a first substrate 110 on (e.g., in) which a plurality of organic light-emitting devices are arranged and a second substrate 120 facing the first substrate 110. The organic light-emitting devices may be arranged in the pixel areas PA, respectively.

The first substrate 110 may include a base substrate and, in each pixel area PA, at least one thin film transistor arranged on the base substrate and an organic light-emitting device coupled to the thin film transistor.

The organic light-emitting device may include a first electrode coupled to the thin film transistor, an organic layer arranged on the first electrode, and a second electrode arranged on the organic layer. One of the first electrode and the second electrode may be an anode electrode and the other may be a cathode electrode. In addition, at least one of the first electrode and the second electrode may be a transmissive (e.g., transparent) electrode. For example, when the organic light-emitting device is a bottom emission type organic light-emitting device, the first electrode may be a transmissive electrode and the second electrode may be a reflective electrode. Alternatively, when the organic light-emitting device is a top emission type organic light-emitting device, the first electrode may be a reflective electrode and the second electrode may be a transmissive electrode. Alternatively, when the organic light-emitting device is a dual emission type organic light-emitting device, both the first electrode and the second electrode may be transmissive electrodes. In the present exemplary embodiment, the organic light-emitting device is described as a top emission type organic light-emitting device as an example.

The first electrode may include a reflective layer and a transparent conductive layer arranged on the reflective layer. The second electrode may include a metal layer having a thickness (e.g., a predetermined thickness) such that light may pass through the metal layer.

The organic layer may include an emitting layer EML and may generally have a multilayer thin film structure. A color of light generated from the emitting layer may be red, green, blue, or white but is not limited thereto. For example, the color of the light emitted from the emitting layer may be magenta, cyan, or yellow.

The second substrate 120 may isolate the organic light-emitting device from external environment and may be bonded to the first substrate 110 by an encapsulant, such as a sealant. The encapsulant may be arranged in the non-display area NDA.

The housing 200 may receive (e.g., accommodate) the organic light-emitting display panel 100, the driving circuit unit 300, the light sensing units 400, and the optical member 500. FIG. 1 illustrates a housing formed from a single member (e.g., a monolith housing) having space in which the organic light-emitting display panel 100, the driving circuit unit 300, the light sensing units 400, and the optical member 500 are received. However, the housing 200 may include (e.g., may be formed of) two or more members or components connected to each other. In the present exemplary embodiment, an example in which the housing 200 is formed of a single member is described.

The housing 200 may include an elastic material. In addition, the housing 200 may include a bottom portion 210 corresponding to a shape of the organic light-emitting display panel 100, a plurality of side surfaces 220 extending from the bottom portion 210 and bent upwards (e.g., bent to extend away from the bottom portion 210), and flanges 230 extending from the side surfaces 220 and bent to be parallel to the bottom portion 210. The bottom portion 210 and the side surfaces 220 may define a space in which the organic light-emitting display panel 100, the driving circuit unit 300, the light sensing units 400, and the optical member 500 are received.

In addition, the flanges 230 may prevent the organic light-emitting display panel 100, the driving circuit unit 300, the light sensing units 400 and the optical member 500 from coming out of (e.g., being inadvertently dislodged from) the housing 200.

The driving circuit unit 300 may be arranged between the organic light-emitting display panel 100 and the bottom portion 210. In addition, the driving circuit unit 300 may include a drive IC, a connection film, and a circuit board.

The drive IC may be a driving chip for driving the organic light-emitting display panel 100 and may include a gate drive IC and a data drive IC. In addition, the drive IC may include a luminance compensation circuit capable of compensating luminance (e.g., configured to compensate luminance) when a reduction in the luminance of the organic light-emitting display panel 100 is sensed.

The connection film may include a plurality of wires formed on a film type substrate. The drive IC may be mounted on the connection film by a tape carrier package (TCP) or a chip on film (COF) so as to be electrically connected to the first substrate 110.

The circuit board may be electrically connected to the first substrate 110 through the connection film and may supply (e.g., transmit) a gate signal and a data signal to the first substrate 110. The circuit board may be a Printed Circuit Board (PCB) or a Flexible Printed Circuit Board (FPCB). The circuit board may include various types of electronic devices, including a power supply and a controller, mounted thereon.

The light sensing units 400 may be attached to one side of the organic light-emitting display panel 100. In addition, each of the light sensing units 400 may include a photo sensor 410 for sensing light emitted from the organic light-emitting display panel 100 and a sensor substrate 420 for mounting the photo sensor 410 thereon.

The photo sensor 410 may be a light receiving element. In addition, the photo sensor 410 may be attached to one side of the organic light-emitting display panel 100 and may sense light emitted from the side of the organic light-emitting display panel 100. The photo sensor 410 may transfer a sensing signal indicating a light sensing result to the driving circuit unit 300. The driving circuit unit 300 may analyze the sensing signal. When luminance degradation of the organic light-emitting display panel 100 is detected, the driving circuit unit 300 may control (e.g., adjust or vary) power supplied to the organic light-emitting display panel 100 by using the luminance compensation circuit.

The sensor substrate 420 may be a printed circuit board and the photo sensor 410 may be mounted thereon. The sensor substrate 420 may transfer the sensing signal generated by the photo sensor 410 to the driving circuit unit 300.

The sensor substrate 420 may be fixed to the housing 200 to reduce or prevent inadvertent movement of the photo sensor 410.

The optical member 500 may be arranged on or above a light-emitting surface of the organic light-emitting display panel 100. The optical member 500 may reduce or prevent deterioration of image display performance of the organic light-emitting display panel 100 due to, for example, reflection of externally incident light (hereinafter, "external light").

For example, the optical member 500 may be a polarization film including a polarizer having a polarizing axis (e.g., a polarizing axis in a predetermined direction) and a retardation film having a phase difference of ¼λ. In addition, the optical member 500 may include a neutral density film and an anti-reflection film.

Figure 4:
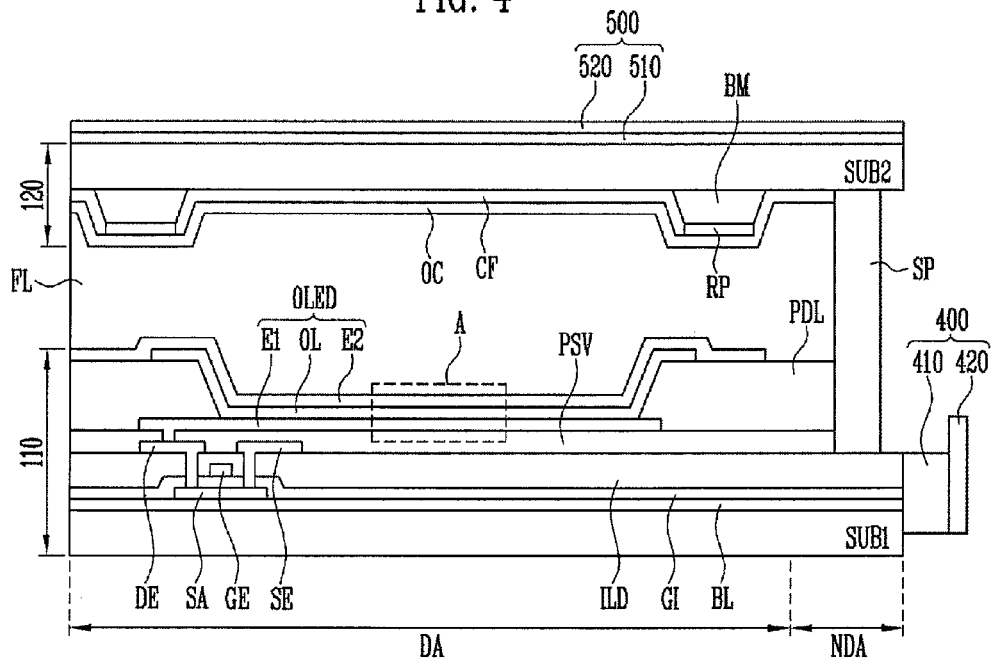
FIG. 4 is a cross-sectional view taken along the line I-I' of FIG. 3.
Figure 5:
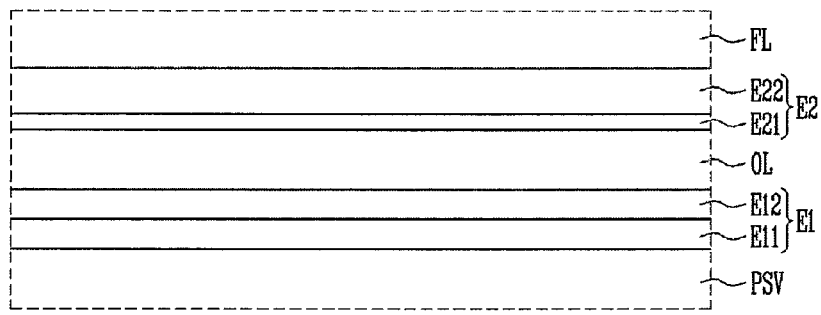
FIG. 5 is an enlarged view of the area A of FIG. 4.

The organic light-emitting display panel 100, the light sensing units 400, and the optical member 500 are described below in more detail with reference to FIGS. 3 to 5.

Figure 3:
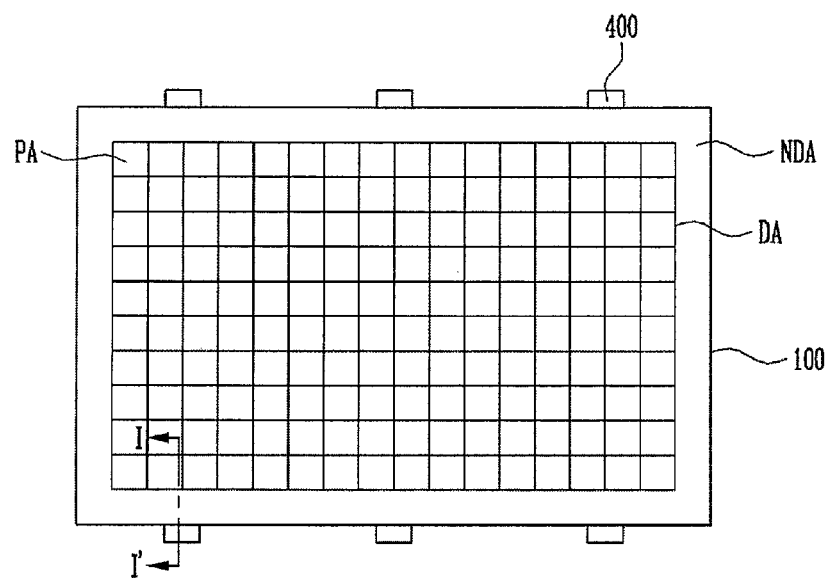
FIG. 3 is a plan view of an organic light-emitting display panel, a light sensing unit, and an optical member shown in FIG. 1.

FIG. 3 is a plan view illustrating the organic light-emitting display panel, the light sensing units, and the optical member shown in FIG. 1. FIG. 4 is a cross-sectional view taken along the line I-I' of FIG. 3. FIG. 5 is an enlarged view of the area A shown in FIG. 4.

Referring to FIGS. 1 to 5, the organic light-emitting display panel 100 may include the display area DA including the plurality of pixel areas PA and the non-display area NDA arranged adjacent to the display area DA.

The organic light-emitting display panel 100 may include the first substrate 110, the second substrate 120 facing the first substrate 110, and an encapsulant SP bonding the first substrate 110 and the second substrate 120 to each other.

The first substrate 110 may include a first base substrate SUB1, at least one thin film transistor formed on the first base substrate SUB1 in each of the pixel areas PA, and an organic light emitting diode OLED coupled to the thin film transistor in the respective pixel areas PA.

The first base substrate SUB1 may be a rigid base substrate. For example, the first base substrate SUB1 may be a glass base substrate, a quartz base substrate, a glass ceramic base substrate, and/or a crystalline glass base substrate.

In addition, the first base substrate SUB1 may be a flexible base substrate. In addition, the first base substrate SUB1 may be a film base substrate including a polymer organic material and/or a plastic base substrate. For example, the first base substrate SUB1 may include polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and/or cellulose acetate propionate (CAP). In addition, the material forming the first base substrate SUB1 may be resistant to (e.g., may have heat resistance to) high processing temperatures present during manufacturing processes.

A buffer layer BL may be arranged between the first base substrate SUB1 and the thin film transistor. The buffer layer BL may be a silicon oxide layer or a silicon nitride layer, or the buffer layer BL may have a multilayer structure including the silicon oxide layer and the silicon nitride layer. The buffer layer BL may reduce or prevent impurities, such as water and oxygen, from entering or being diffused into a semiconductor active layer SA of the thin film transistor. The buffer layer BL may planarize a surface of the first base substrate SUB1 (e.g., may provide a planar surface above the first base substrate SUB1).

The thin film transistor may include the semiconductor active layer SA, a gate electrode GE, a source electrode SE, and a drain electrode DE.

The semiconductor active layer SA may be arranged on the buffer layer BL. The semiconductor active layer SA may include amorphous silicon (a-Si), polycrystalline silicon (p-Si), and/or an oxide semiconductor. In addition, portions of the semiconductor active layer SA which are connected to the source electrode SE and the drain electrode DE may be a source region and a drain region, respectively, into which impurities are doped or injected. An area between the source region and the drain region may be a channel area. The oxide semiconductor may include zinc (Zn), indium (In), gallium (Ga), tin (Sn), and/or a mixture thereof. For example, the oxide semiconductor may include Indium-Gallium-Zinc Oxide (IGZO).

When the semiconductor active layer SA includes the oxide semiconductor, a light blocking layer for blocking light from entering the semiconductor active layer SA may be arranged on or under the semiconductor active layer SA.

A gate insulating layer GI may be arranged on the semiconductor active layer SA. The gate insulating layer GI may cover the semiconductor active layer SA and insulate the semiconductor active layer SA and the gate electrode GE from each other. The gate insulating layer GI may include a silicon oxide (e.g., $SiO_2$) and/or a silicon nitride ($SiN_x$).

The gate electrode GE may be arranged on the gate insulating layer GI. The gate electrode GE may overlap the semiconductor active layer SA. The gate electrode GE may include aluminum (AL), an aluminum alloy (Al-alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), and/or an alloy or a combination thereof.

An interlayer insulating layer ILD may be arranged on the gate electrode GE. The interlayer insulating layer ILD may include substantially the same or the same material as the gate insulating layer GI. For example, the interlayer insulating layer ILD may include a silicon oxide (e.g., $SiO_2$) and/or a silicon nitride ($SiN_x$).

The source electrode SE and the drain electrode DE may be arranged on the interlayer insulating layer ILD. The source electrode SE and the drain electrode DE may be insulated from the gate electrode GE by the interlayer insulating layer ILD. In addition, the source electrode SE and the drain electrode DE may be coupled to the source region and the drain region, respectively.

In the present exemplary embodiment, reference is made to an example in which the thin film transistor is a top gate-thin film transistor. However, the thin film transistor is not limited thereto. For example, the thin film transistor may be a bottom gate-thin film transistor.

A protective layer PSV may be arranged on the first base substrate SUB1 on which the thin film transistor is arranged. The protective layer PSV may include at least one layer. For example, the protective layer PSV may include an inorganic protective layer and an organic protective layer arranged on the inorganic protective layer. The inorganic protective layer may include a silicon oxide and/or a silicon nitride. In addition, the organic protective layer may include an acryl, a polyimide (PI), a polyamide (PA), and/or benzocyclobutene (BCB). For example, the organic protective layer may be a planarizing layer which is transparent and flexible to smooth and planarize roughness of a lower structure (e.g., to provide a smooth and planar surface over a lower structure). In addition, a portion of the protective layer PSV may be removed to expose a portion of the drain electrode DE.

The organic light emitting diode OLED, coupled to the drain electrode DE of the thin film transistor, may be arranged on the protective layer PSV.

The organic light emitting diode OLED may include a first electrode E1, an organic layer OL arranged on the first electrode E1, and a second electrode E2 arranged on the organic layer OL.

The first electrode E1 may be coupled to the drain electrode DE. In addition, the first electrode E1 may include a reflective layer E11 and/or a transparent conductive layer E12 arranged on the reflective layer E11. The reflective layer E11 and/or the transparent conductive layer E12 may be coupled to the drain electrode DE. For example, the reflective layer E11 may be coupled to the drain electrode DE.

The reflective layer E11 may include a light reflective material. For example, the reflective layer E11 may include aluminum (Al), silver (Ag), chrome (Cr), molybdenum (Mo), platinum (Pt), nickel (Ni), and an alloy or a combination thereof.

The transparent conductive layer E12 may be a conductive layer including at least one transparent conductive oxide, such as an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), and/or a fluorine doped tin oxide (FTO).

A pixel defining layer PDL may be arranged on the first electrode E1. The pixel defining layer PDL may have openings therein. The first electrode E1 and, in one embodiment, a portion of the transparent conductive layer E12, may be exposed through the opened area of the pixel defining layer PDL.

In addition, the pixel defining layer PDL may include an organic insulating material. For example, the pixel defining layer PDL may include at least one of polystyrene, polymethylmethacrylate (PMMA), polyacrylonitrile (PAN), a polyamide, a polyimide, poly (aryl ether), a heterocyclic polymer, parylene, a fluorinated polymer, an epoxy resin, a benzocyclobutene series resin, a siloxane series resin, and/or a silane resin.

The organic layer OL may be arranged on the first electrode E1 and may be exposed through the pixel defining layer PDL. The organic layer OL may include the emitting layer EML and may have a multilayer thin film structure. For example, the organic layer OL may include: a hole injection layer HIL for injecting holes; a hole transport layer HTL having an excellent hole transporting property and for suppressing movement of electrons which fail to be combined in the emitting layer EML to increase the recombination probability of electrons and holes; the emitting layer EML for emitting light through the re-combination of the injected electrons and holes; a hole blocking layer HBL for suppressing movement of holes which fail to be combined in the emitting layer EML; an electron transport layer ETL for smoothly transporting electrons to the emitting layer EML; and/or an electron injection layer (EIL) for injecting electrons. A color of light generated in the emitting layer may be red, green, blue, or white but is not limited thereto. For example, the color of light generated in the emitting layer of the organic layer OL may be magenta, cyan, or yellow.

The second electrode E2 may be arranged on the organic layer OL. The second electrode E2 may include a first conductive layer E21 arranged on the organic layer OL and/or a second conductive layer E22 arranged on the first conductive layer E21.

The first conductive layer E21 may transmit light emitted from the organic layer OL. For example, the first conductive layer E21 may be a thin metal layer which transmits light (e.g., may be a transparent layer). In addition, the first conductive layer E21 may include a material having a lower work function than that of the transparent conductive layer E12. For example, the first conductive layer E21 may include molybdenum (Mo), tungsten (W), silver (Ag), magnesium (Mg), aluminum (AL), platinum (Pt), palladium (Pd), gold (Au), nickel (Ni), neodymium (Nd), iridium (Ir), chrome (Cr), lithium (Li), calcium (Ca), and/or an alloy or a combination thereof.

The first conductive layer E21 may be a very thin film (e.g., may be thinner than other thin films in the display apparatus). Therefore, an increased voltage drop (IR-drop) may occur at the first conductive layer E21, and the voltage drop may vary depending on a position along the first conductive layer E21.

The second conductive layer E22 may transmit the light having passed through the first conductive layer E21. In addition, the second conductive layer E22 may reduce or substantially prevent IR drop at the first conductive layer E21. The second conductive layer E22 may include substantially the same or the same material as the transparent conductive layer E12. For example, the second conductive layer E22 may be a conductive layer including at least one transparent conductive oxide, such as an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), and/or a fluorine doped tin oxide (FTO).

A portion of light emitted from the organic layer OL may not pass through the first conductive layer E21 but may be reflected. The light reflected by the first conductive layer E21 may be reflected again by the reflective layer E11 of the first electrode E1. For example, resonance of light emitted from the organic layer OL may occur between the first conductive layer E21 and the second conductive layer E22. Light extraction efficiency of the organic light emitting diode OLED may be improved due to this resonance.

In addition, in each of the pixel areas PA, the distance between the reflective layer E11 and the first conductive layer E21 may vary depending on a color of light to be emitted. For example, the distance between the reflective layer E11 and the first conductive layer E21 may be controlled (e.g., varied or selected) to correspond to a resonance distance of the color of light to be emitted from the organic layer OL.

The second substrate 120 may include a second base substrate SUB2, a black matrix BM arranged on a surface of the second base substrate SUB2 facing the first substrate 110, color filters CF arranged in spaces of the black matrix BM (e.g., arranged between or in openings of the black matrix BM), a reflective pattern RP, and an overcoat layer OC arranged between the color filter CF and the reflective pattern RP.

The second base substrate SUB2 may be substantially the same or the same as the first base substrate SUB1. For example, when the first base substrate SUB1 is a rigid base substrate, the second base substrate SUB2 may also be a rigid base substrate. In another example, when the first base substrate SUB1 is a flexible substrate, the second base substrate SUB2 may also be a flexible base substrate.

The black matrix BM may include a material capable of blocking light (e.g., configured to block light). The black matrix BM may be arranged between the pixel areas PA. For example, the black matrix BM may have a lattice shape or structure. Therefore, the black matrix BM may prevent mixing of light emitted from adjacent pixel areas PA which emit different color light.

The color filters CF may be located at positions corresponding to the pixel areas PA. A color of each of the color filters CF may be substantially the same or the same as a color of light emitted from the organic layer OL of each of the respective pixel areas PA. For example, the color of each of the color filters CF may be red, green, or blue but is not limited thereto. For example, the color of each of the color filters CF may be cyan, magenta, or yellow. Therefore, the color filters CF may improve color purity of the light emitted from the organic layer OL.

The reflective pattern RP may be arranged on the black matrix BM and reflect the light emitted from the organic layer OL. Therefore, a planar shape of the reflective pattern RP may be substantially the same or the same as that of the black matrix BM. For example, the reflective pattern RP may have a lattice shape or structure.

The reflective pattern RP may include a material capable of reflecting light (e.g., configured to reflect light). For example, the reflective pattern RP may include aluminum (AL), an aluminum alloy (Al-alloy), silver (Ag), a silver alloy (Ag-alloy), chrome (Cr), a chrome alloy (Cr-alloy), molybdenum (Mo), a molybdenum alloy (Mo-alloy), platinum (Pt), nickel (Ni), a nickel alloy (Ni-alloy), AlNiLa, and/or an alloy or a combination thereof.

The overcoat layer OC may cover the color filters CF, the black matrix BM, and the reflective pattern RP. The overcoat layer OC may reduce or prevent exposure of the color filters CF and the reflective pattern RP.

In addition, the overcoat layer OC may include a transparent insulating material. For example, the overcoat layer OC may include a transparent inorganic insulating material and/or a transparent organic insulating material. When the overcoat layer OC includes the transparent organic insulating material, the overcoat layer OC may provide a smooth and planar surface of the second substrate 120 by removing surface roughness of the second substrate 120 caused by the color filters CF, the black matrix BM and the reflective pattern RP.

The encapsulant SP may be arranged in the non-display area and may bond the first substrate 110 and the second substrate 120 to each other. In addition, because the encapsulant SP has relatively low oxygen and water permeability, the encapsulant SP may isolate the organic light emitting diode OLED from the external environment. The encapsulant SP may reduce or prevent the material of the protective layer PSV and/or the pixel defining layer PDL from flowing to the side thereof or spreading.

The encapsulant SP may include a photocurable resin and/or a thermosetting resin. For example, the encapsulant SP may include an epoxy resin having ultraviolet curing properties.

The encapsulant SP may transmit visible light. Therefore, a portion of light reflected by the reflective pattern RP may transmit through the encapsulant SP and move to (e.g., be received or sensed by) the light sensing units 400.

The organic light-emitting display panel 100 may further include a filler FL filling a space between the first substrate 110 and the second substrate 120. The filler FL may reduce or prevent damage to the organic light emitting diode OLED from external impacts.

The filler FL may include a colorless, liquefied or gel-like material capable of transmitting light. For example, as the gel-like material, the filler FL may include a bisphenol A type epoxy, a cycloaliphatic epoxy resin, a phenyl silicon resin or rubber, an acrylic epoxy resin, and/or an aliphatic urethane acrylate. In addition, as the liquefied material, the filler FL may include hexamethyldisiloxane, octamethyl-trisiloxane, decamethyltetrasiloxane, dodecamethylpentasiloxane, and/or polydimethylsiloxanes.

In addition, the filler FL may include a moisture-absorbing material.

The light sensing units 400 may be arranged at one side (e.g., at one lateral side) of the organic light-emitting display panel 100. In addition, each of the light sensing units 400 may include a photo sensor 410 and the sensor substrate 420 on which the photo sensor 410 is mounted.

The photo sensor 410 may face the organic light-emitting display panel 100 (e.g., may face a side of the organic light-emitting display panel 100), and in one embodiment, one surface of the first substrate 110. Therefore, the photo sensor 410 may sense light emitted from the side of the first substrate 110. A signal detected by the photo sensor 410 may be transferred to the driving circuit unit 300 through the sensor substrate 420 (e.g., through circuitry in the sensor substrate 420).

The optical member 500 may be arranged along an emission direction of the light which is emitted from the organic light-emitting display panel 100 and may prevent reflection. The optical member 500 may include a neutral density film 510 and an anti-reflection film 520 arranged on the neutral density film 510.

The neutral density film 510 may have light-shielding characteristics being neutral with respect to color (e.g., not affecting or substantially affecting the color of light passing therethrough). The neutral density film 510 may provide a harmonious color balance by reducing the transmission amount of light having certain wavelengths to be similar to each other in a specific wavelength range.

The anti-reflection film 520 may reduce surface reflection to increase efficiency and remove interference or scattering caused by reflected light.

In the present exemplary embodiment, the organic light emitting diode OLED may be a top emission type organic light-emitting device. In the top emission type organic light-emitting device, most of the light may be emitted in a direction toward the second substrate 120 and a small amount of light may be emitted from the side of the organic light-emitting display panel 100. For example, a very small amount of light may be emitted from the side of the first substrate 110. When the amount of light emitted from the side of the first substrate 110 is less than a sensing critical value of the photo sensor 410, the photo sensor 410 may not sense a brightness reduction of the organic light-emitting display panel 100.

However, although the organic light emitting diode OLED of the organic light-emitting display apparatus according to the present exemplary embodiment is a top emission type organic light-emitting device, the light sensing units 400 may sense luminance reduction of the organic light-emitting display panel 100.

In one embodiment, a portion of the light emitted from the organic light emitting diode OLED may be reflected by the reflective pattern RP. An optical path of the light reflected by the reflective pattern RP may be changed to be in a direction toward the first substrate 110 so that the light may enter the first substrate 110. The light entering the first substrate 110 may be totally reflected in the first substrate 110 (e.g., the light may be reflected at the interfaces between the buffer layer BL, the gate insulating layer GI, and the interlayer insulating layer ILD). The totally reflected light may be guided to the side of the first substrate 110. The light guided to the side of the first substrate 110 may be emitted from the side of the first substrate 110 and may be sensed by the photo sensor 410. For example, the reflective pattern RP may increase the amount of light supplied to the photo sensor 410.

A signal sensed by the photo sensor 410 may be transferred to the driving circuit unit 300 through the sensor substrate 420. When the driving circuit unit 300 analyzes the sensed signal and determines that the luminance of the organic light-emitting display panel 100 is reduced, the driving circuit unit 300 may compensate for the luminance reduction.

Hereinafter, other embodiments of the present invention will be described with reference to FIGS. 6 to 15. In FIGS. 6 to 15, the same or substantially similar components as those illustrated in FIGS. 1 to 5 are denoted by the same reference numerals and a detailed description thereof may be omitted. In addition, to avoid repetition of description, differences from FIGS. 1 to 5 will be primarily described with reference to FIGS. 6 to 15.

Figure 6:
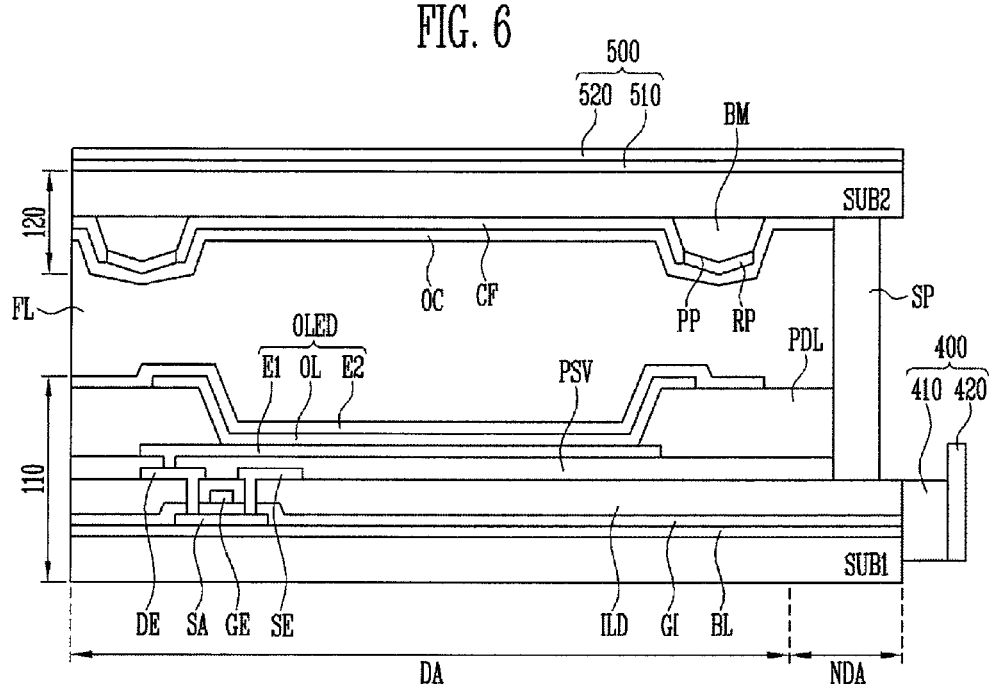
FIGS. 6 to 9 are cross-sectional views of an organic light-emitting display apparatus according to other embodiments of the present invention.

FIG. 6 is a cross-sectional view of an organic light-emitting display apparatus according to another embodiment of the present invention.

Referring to FIG. 6, the organic light-emitting display panel 100 of the organic light-emitting display apparatus may include the display area DA and the non-display area NDA arranged adjacent to the display area DA.

The organic light-emitting display panel 100 may include the first substrate 110, the second substrate 120 facing the first substrate 110, and the encapsulant SP bonded to the first substrate 110 and the second substrate 120.

The first substrate 110 may include the first base substrate SUB1, at least one thin film transistor formed on the first base substrate SUB1 in each pixel area PA, and the organic light emitting diode OLED coupled to the thin film transistor in the pixel area PA.

The second substrate 120 may include the second base substrate SUB2, the black matrix BM arranged on a surface of the second base substrate SUB2 facing the first substrate 110, the color filters CF arranged in spaces of the black matrix BM, the reflective pattern RP arranged on the black matrix BM, and the overcoat layer OC arranged between the color filter CF and the reflective pattern RP.

The black matrix BM may include a protruding portion PP protruding in a direction of the first substrate 110. The protruding portion PP may include at least one inclined surface.

The reflective pattern RP may be arranged on the black matrix BM and may reflect light emitted from the organic layer OL. In addition, the reflective pattern RP may protrude in the direction toward the first substrate 110 due to the protruding portion PP. For example, the reflective pattern RP may have a shape corresponding to the protruding portion PP. Therefore, like the protruding portion PP, the reflective pattern RP may include at least one inclined surface.

The reflective pattern RP may reflect light emitted from the organic layer OL of the organic light emitting diode OLED in the direction toward the first substrate 110. A portion of the light reflected by the reflective pattern RP may be totally reflected in the first substrate 110 and move to the photo sensor 410.

Figure 7:
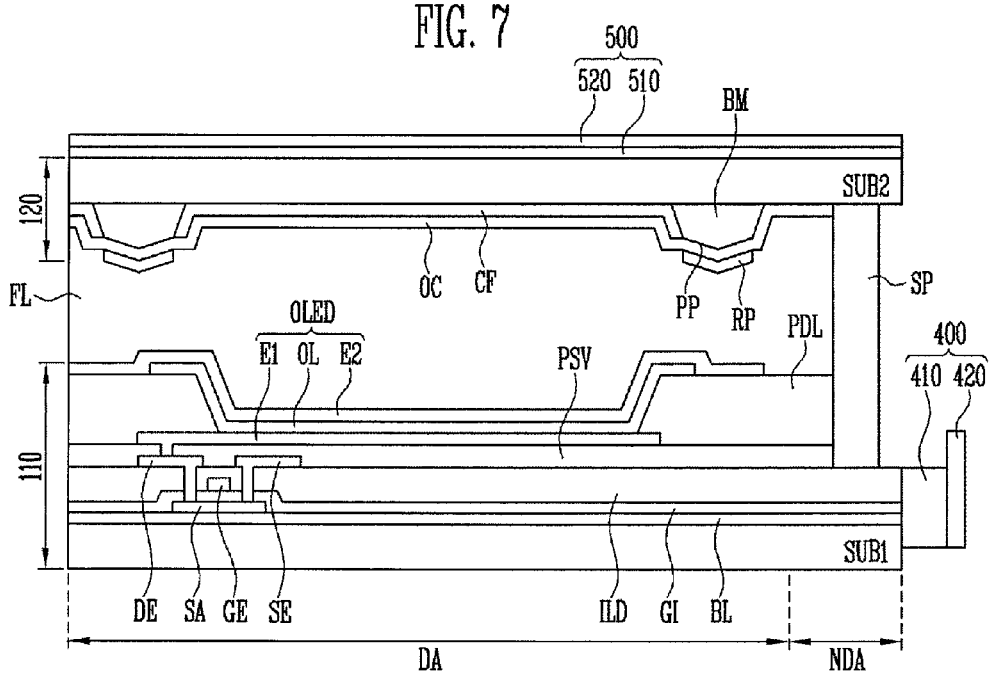

FIG. 7 is a cross-sectional view of an organic light-emitting display apparatus according to another embodiment of the present invention.

Referring to FIG. 7, the organic light-emitting display panel 100 of the organic light-emitting display apparatus may include the display area DA and the non-display area NDA arranged adjacent to the display area DA.

The organic light-emitting display panel 100 may include the first substrate 110, the second substrate 120 facing the first substrate 110, and the encapsulant SP bonding the first substrate 110 and the second substrate 120 to each other.

The first substrate 110 may include the first base substrate SUB1, at least one thin film transistor formed on the first base substrate SUB1 in each pixel area PA, and the organic light emitting diode OLED coupled to the thin film transistor in the pixel area PA.

The second substrate 120 may include the second base substrate SUB2, the black matrix BM arranged on a surface of the second base substrate SUB2 facing the first substrate 110, the color filters CF arranged in spaces of the black matrix BM, the overcoat layer OC arranged on the black matrix BM and the color filters CF, and the reflective pattern RP overlapping the black matrix BM on the overcoat layer OC.

The black matrix BM may include the protruding portion PP protruding in the direction toward the first substrate 110. The protruding portion PP may include at least one inclined surface.

The overcoat layer OC may include a transparent inorganic insulating material. Therefore, the overcoat layer OC may have a surface shape corresponding to surface roughness of the second substrate 120 caused by the black matrix BM and the color filters CF. For example, the overcoat layer OC may have a shape corresponding to the protruding portion PP at a position corresponding to the black matrix BM.

The reflective pattern RP may overlap the black matrix BM on the overcoat layer OC. Therefore, the reflective pattern RP may protrude toward the first substrate 110 due to the protruding portion PP. For example, the reflective pattern RP may have a shape corresponding to the protruding portion PP. Therefore, similar to the protruding portion PP, the reflective pattern RP may include at least one inclined surface.

The reflective pattern RP may reflect the light emitted from the organic layer OL of the organic light emitting diode OLED in the direction toward the first substrate 110. A portion of the light reflected by the reflective pattern RP may be totally reflected in the first substrate 110 and move to the photo sensor 410.

Figure 8:
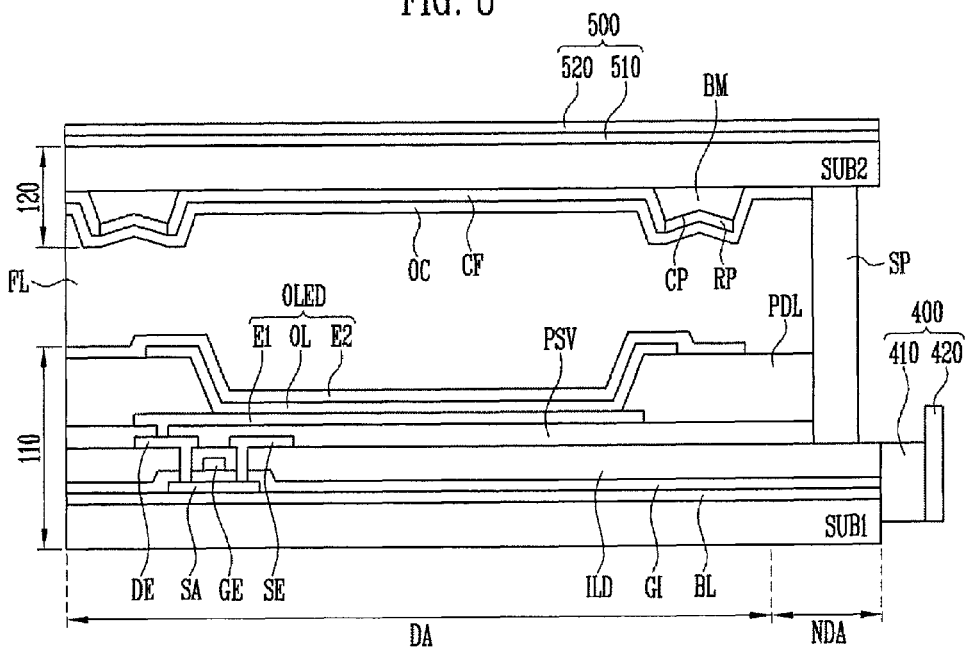

FIG. 8 is a cross-sectional view of an organic light-emitting display apparatus according to another embodiment of the present invention.

Referring to FIG. 8, the organic light-emitting display panel 100 of the organic light-emitting display apparatus may include the display area DA and the non-display area NDA arranged adjacent to the display area DA.

The organic light-emitting display panel 100 may include the first substrate 110, the second substrate 120 facing the first substrate 110, and the encapsulant SP bonding the first substrate 110 and the second substrate 120 to each other.

The first substrate 110 may include the first base substrate SUB1, at least one thin film transistor formed on the first base substrate SUB1 in each pixel area PA, and the organic light emitting diode OLED coupled to the thin film transistor in the pixel area PA.

The second substrate 120 may include the second base substrate SUB2, the black matrix BM arranged on a surface of the second base substrate SUB2 facing the first substrate 110, the color filters CF arranged in spaces of the black matrix BM, the reflective pattern RP arranged on the black matrix BM, and the overcoat layer OC arranged on the color filter CF and the reflective pattern RP.

The black matrix BM may include a recessed portion CP. The recessed portion CP may include at least one inclined surface.

The reflective pattern RP may be arranged on the black matrix BM and may reflect light emitted from the organic layer OL. In addition, the reflective pattern RP may have a shape which is depressed (e.g., depressed towards the second substrate SUB2) due to the recessed portion CP. For example, the reflective pattern RP may have a shape corresponding to the recessed portion CP. Therefore, similar to the recessed portion CP, the reflective pattern RP may include at least one inclined surface.

The reflective pattern RP may reflect the light emitted from the organic layer OL of the organic light emitting diode OLED in the direction toward the first substrate 110. A portion of the light reflected by the reflective pattern RP may be totally reflected in the first substrate 110 and move to the photo sensor 410.

Figure 9:
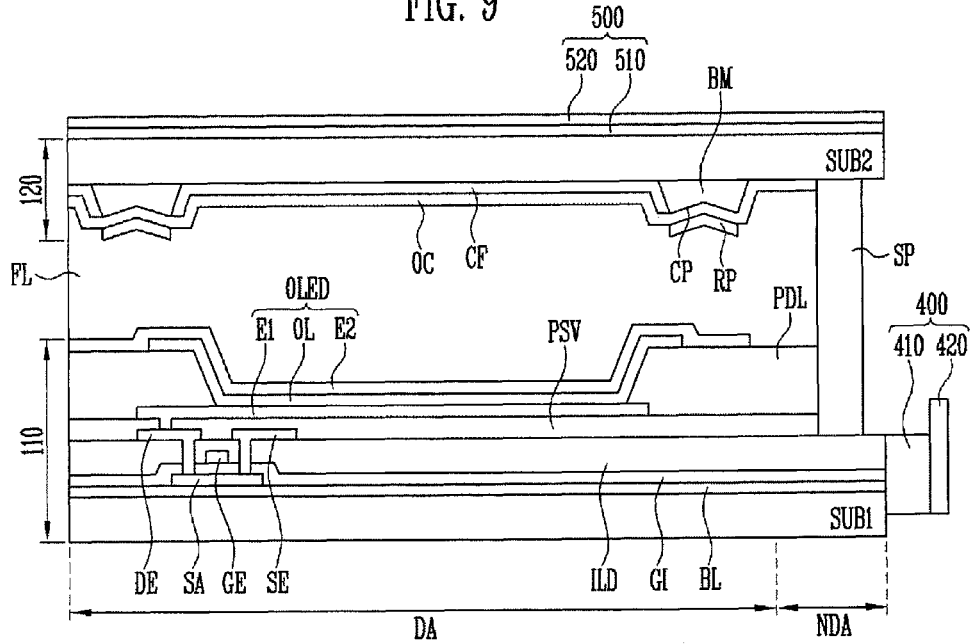

FIG. 9 is a cross-sectional view of an organic light-emitting display apparatus according to another embodiment of the present invention.

Referring to FIG. 9, the organic light-emitting display panel 100 of the organic light-emitting display apparatus may include the display area DA and the non-display area NDA arranged adjacent to the display area DA.

The organic light-emitting display panel 100 may include the first substrate 110, the second substrate 120 facing the first substrate 110, and the encapsulant SP bonding the first substrate 110 and the second substrate 120 to each other.

The first substrate 110 may include the first base substrate SUB1, at least one thin film transistor formed on the first base substrate SUB1 in each pixel area PA, and the organic light emitting diode OLED coupled to the thin film transistor on the pixel area PA.

The second substrate 120 may include the second base substrate SUB2, the black matrix BM formed on a surface of the second base substrate SUB2 facing the first substrate 110, the color filters CF formed on spaces of the black matrix BM, the overcoat layer OC formed on the black matrix BM and the color filter CF, and the reflective pattern RP overlapping the black matrix BM on the overcoat layer OC.

The black matrix BM may include the recessed portion CP. The recessed portion CP may include at least one inclined surface.

The overcoat layer OC may include a transparent inorganic insulating material. Therefore, the overcoat layer OC may have a shape corresponding to surface roughness of the second substrate 120 caused by the black matrix BM and the color filters CF. For example, the overcoat layer OC may have a shape corresponding to the recessed portion CP at a position corresponding to the black matrix BM.

The reflective pattern RP may overlap the black matrix BM on the overcoat layer OC. Therefore, the reflective pattern RP may have a depressed shape (e.g., depressed toward the second substrate SUB2) due to the recessed portion CP. For example, the reflective pattern RP may have a shape corresponding to the recessed portion CP. Therefore, similar to the recessed portion CP, the reflective pattern RP may include at least one inclined surface.

The reflective pattern RP may reflect light emitted from the organic layer OL of the organic light emitting diode OLED in the direction toward the first substrate 110. A portion of the light reflected by the reflective pattern RP may be totally reflected in the first substrate 110 and move to the photo sensor 410.

Figure 10:
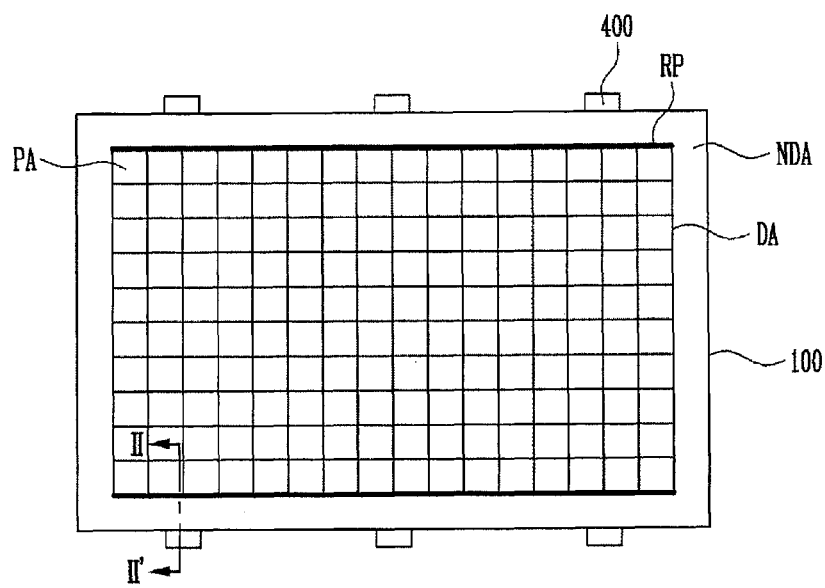
FIG. 10 is a plan view of an organic light-emitting display apparatus according to another embodiment of the present invention.
Figure 11:
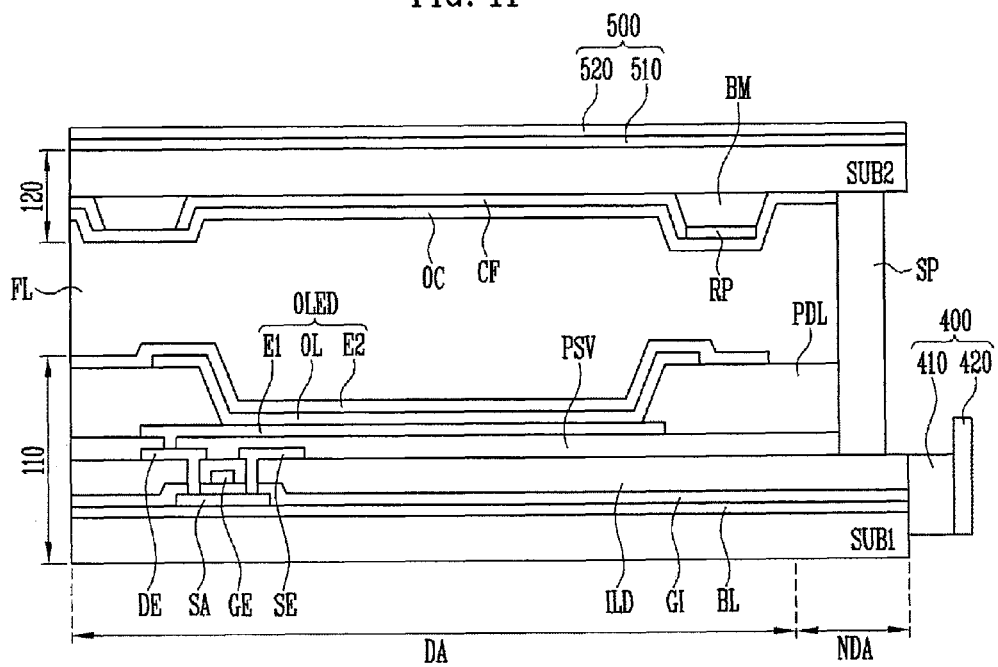
FIG. 11 is a cross-sectional view taken along the line II-II' of FIG. 10.

FIG. 10 is a plan view of an organic light-emitting display apparatus according to another embodiment of the present invention. FIG. 11 is a cross-sectional view taken along the line II-II' of FIG. 10.

Referring to FIGS. 10 and 11, the organic light-emitting display panel 100 of the organic light-emitting display apparatus may include the display area DA including the plurality of pixel areas PA and the non-display area NDA arranged adjacent to the display area DA.

The organic light-emitting display panel 100 may include the first substrate 110, the second substrate 120 facing the first substrate 110, and the encapsulant SP bonding the first substrate 110 and the second substrate 120 to each other.

The first substrate 110 may include the first base substrate SUB1, at least one thin film transistor formed on the first base substrate SUB1 in each pixel area PA, and the organic light emitting diode OLED coupled to the thin film transistor in the pixel area PA.

The second substrate 120 may include the second base substrate SUB2, the black matrix BM arranged on a surface of the second base substrate SUB2 facing the first substrate 110, the color filters CF arranged on spaces of the black matrix BM, the reflective pattern RP arranged on the black matrix BM, and the overcoat layer OC arranged on the color filter CF and the reflective pattern RP.

The black matrix may be arranged between the pixel areas PA. For example, the black matrix BM may have a lattice shape or structure.

The reflective pattern RP may be arranged only at (e.g., on) an area of the black matrix BM which is adjacent to (e.g., at a portion of the black matrix BM which is directly adjacent to) the non-display area NDA. In one embodiment, the reflective pattern RP may be arranged on the black matrix BM adjacent to the light sensing units 400.

The reflective pattern RP may reflect light emitted from the organic light emitting diode OLED, and in one embodiment, the reflective pattern RP may reflect light emitted from the organic layer OL of the organic light emitting diode OLED arranged in the pixel area PA adjacent to the non-display area NDA in a direction toward the first substrate 110. A portion of the light reflected by the reflective pattern RP may be totally reflected in the first substrate 110 and move to the photo sensor 410.

Figure 12:
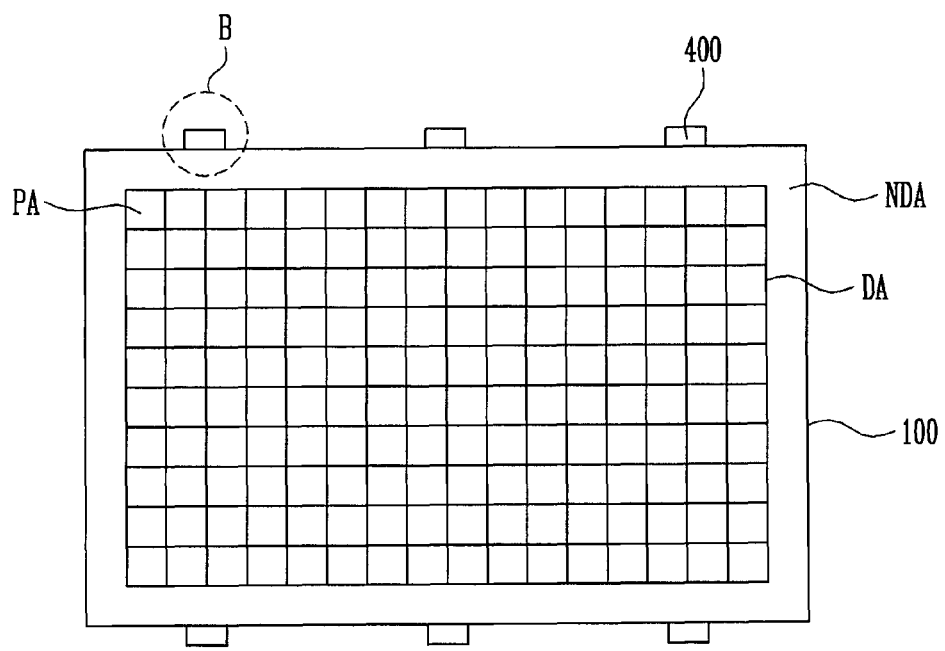
FIG. 12 is a plan view of an organic light-emitting display apparatus according to another embodiment of the present invention.
Figure 13:
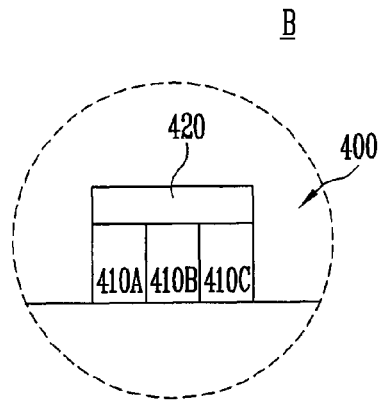
FIG. 13 is an enlarged view of the area B of FIG. 12.

FIG. 12 is a plan view of an organic light-emitting display apparatus according to another embodiment of the present invention. FIG. 13 is an enlarged view of the area B shown in FIG. 12.

Referring to FIGS. 12 and 13, the organic light-emitting display panel 100 of the organic light-emitting display apparatus may include the display area DA including the plurality of pixel areas PA and the non-display area NDA arranged adjacent to the display area DA.

Light emitted from the pixel areas PA may have different colors. For example, the light emitted from each of the pixel areas PA may be red, green, blue, cyan, magenta, or yellow. In the present exemplary embodiment, the light emitted from the pixel areas PA may be red, green or blue.

The organic light-emitting display panel 100 may include the first substrate 110, the second substrate 120 facing the first substrate 110, and the encapsulant SP bonding the first substrate 110 and the second substrate 120 to each other.

The first substrate 110 may include the first base substrate SUB1, at least one thin film transistor formed on the first base substrate SUB1 in each pixel area PA, and the organic light emitting diode OLED coupled to the thin film transistor in the pixel area PA.

The second substrate 120 may include the second base substrate SUB2, the black matrix BM arranged on a surface of the second base substrate SUB2 facing the first substrate 110, the color filters CF arranged in spaces of the black matrix BM, the reflective pattern RP arranged on the black matrix BM, and the overcoat layer OC arranged on the color filter CF and the reflective pattern RP.

The reflective pattern RP may reflect light emitted from the organic layer OL of the organic light emitting diode OLED in the direction toward the first substrate 110. A portion of the light reflected by the reflective pattern RP may be totally reflected in the first substrate 110 and move to the light sensing units 400.

The light sensing units 400 may be at (e.g., may be attached to) one surface of (e.g., at one side of) the organic light-emitting display panel 100. In addition, each of the light sensing units 400 may include photo sensors 410A-C for sensing light emitted from the organic light-emitting display panel 100 and the sensor substrate 420 on which the photo sensors 410A-C are mounted.

The photo sensors 410A-C may be attached to the side of the organic light-emitting display panel 100 and sense light emitted from the side of the organic light-emitting display panel 100. In addition, the photo sensors 410A-C may each sense light of a different color. For example, the first photo sensor 410A may sense light of one color, such as red, green, or blue, for example, red light. The second photo sensor 410B may sense light of another color, for example, green light. The third photo sensor 410C may sense light of yet another color, for example, blue light.

Each of the photo sensors 410A-C may transfer a sensing signal indicating a result of sensing the red, green, and blue lights, respectively, to the driving circuit unit 300. The driving circuit unit 300 may analyze the sensing signal. In the organic light-emitting display panel 100, when luminance deterioration of a certain color (e.g., a predetermined color) is found or determined, the driving circuit unit 300 may control power supplied to the organic light-emitting display panel 100 to compensate luminance of the color with luminance degradation.

In the present exemplary embodiment, an example in which the plurality of photo sensors 410A-C are mounted on the single sensor substrate 420 has been described, but the present invention is not limited thereto. For example, the light sensing units 400 may include a plurality of sensor substrates 420, and each of the sensor substrates 420 may include one of the photo sensors 410A-C.

FIG. 14 is a plan view of an organic light-emitting display apparatus according to another embodiment of the present invention. FIG. 15 is a cross-sectional view taken along the line III-III' of FIG. 14.

Referring to FIGS. 1, 2, 14, and 15, the organic light-emitting display apparatus may include the organic light-emitting display panel 100, the housing 200, the driving circuit unit 300, the plurality of light sensing units 400, and the optical member 500.

The organic light-emitting display panel 100 may include the display area DA including the plurality of pixel areas PA and the non-display area NDA arranged adjacent to the display area DA.

The organic light-emitting display panel 100 may include the first substrate 110, the second substrate 120 facing the first substrate 110, and the encapsulant SP bonding the first substrate 110 and the second substrate 120 to each other.

The first substrate 110 may include the first base substrate SUB1, at least one thin film transistor formed on the first base substrate SUB1 in each pixel area PA, and the organic light emitting diode OLED coupled to the thin film transistor in the pixel area PA.

Light emitted from the pixel areas PA may have different colors. For example, the light emitted from the pixel areas PA may be red, green, or blue. For example, in the pixel areas PA, the organic light emitting diode OLED may emit light that is red, green, or blue.

The second substrate 120 may include the second base substrate SUB2, the black matrix BM arranged on a surface of the second base substrate SUB2 facing the first substrate 110, the reflective pattern RP arranged on the black matrix BM, and the overcoat layer OC covering the reflective pattern RP. For example, in this embodiment, the second substrate 120 may not include color filters. Therefore, spaces in the black matrix BM of the second substrate 120 may function as transmissive windows through which light passes.

The light sensing units 400 may be attached to one surface of the organic light-emitting display panel 100. In addition, each of the light sensing units 400 may include the photo sensor 410 for sensing light emitted from the organic light-emitting display panel 100 and the sensor substrate 420 on which the photo sensor 410 is mounted.

The optical member 500 may be a polarization film. For example, the optical member 500 may include a polarizer 540 having a polarizing axis (e.g., a polarizing axis in a predetermined direction) and a retardation film 530 having phase of ¼λ. The retardation film 530 may be arranged between the organic light-emitting display panel 100 and the polarizer 540. The optical member 500 may convert the external light into circularly polarized light to reduce or prevent the external light from being reflected and, accordingly, reduce or prevent a reduction in image display performance of the organic light-emitting display panel 100.

Example embodiments of the present invention have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims and their equivalents.

What is claimed is:

1. An organic light-emitting display apparatus comprising:
   an organic light-emitting display panel having a display area and a non-display area, the display area comprising a plurality of pixel areas, the non-display area being adjacent the display area, the organic light-emitting display panel comprising:
      a first substrate comprising an organic light-emitting device on a first base substrate; and
      a second substrate comprising a black matrix between the plurality of pixel areas at a side of a second base substrate facing the first substrate and a reflective pattern on the black matrix; and
   a light sensing unit at one side of the organic light-emitting display panel.

2. The organic light-emitting display apparatus of claim 1, wherein the organic light-emitting device is a top emission type organic light-emitting device.

3. The organic light-emitting display apparatus of claim 2, wherein the black matrix comprises at least one of a protruding portion protruding in a direction toward the first substrate and a recessed portion recessed in a direction away from the first substrate, and
wherein the reflective pattern has a shape corresponding to the protruding portion.

4. The organic light-emitting display apparatus of claim 3, wherein each of the protruding portion and the recessed portion has an inclined surface.

5. The organic light-emitting display apparatus of claim 2, wherein the reflective pattern is on a portion of the black matrix that is adjacent to the non-display area.

6. The organic light-emitting display apparatus of claim 2, wherein the organic light-emitting device comprises:
a first electrode comprising a reflective layer and a transparent conductive layer on the reflective layer;
an organic layer on the first electrode and comprising an emitting layer; and
a second electrode on the organic layer and comprising a transparent first conductive layer.

7. The organic light-emitting display apparatus of claim 6, wherein the first conductive layer comprises a transparent metal layer.

8. The organic light-emitting display apparatus of claim 6, wherein the second electrode further comprises a transparent second conductive layer on the transparent first conductive layer.

9. The organic light-emitting display apparatus of claim 1, wherein the second substrate comprises an overcoat layer on the second base substrate, and the black matrix and the reflective pattern are between the overcoat layer and the second base substrate.

10. The organic light-emitting display apparatus of claim 1, wherein the second substrate comprises an overcoat layer between the black matrix and the reflective pattern and on the second base substrate.

11. The organic light-emitting display apparatus of claim 1, wherein the light sensing unit comprises:
a photo sensor facing a side of the organic light-emitting display panel; and
a sensor substrate on which the photo sensor is mounted.

12. The organic light-emitting display apparatus of claim 11, wherein the second substrate comprises a plurality of color filters in spaces of the black matrix and having different colors.

13. The organic light-emitting display apparatus of claim 12, further comprising an optical member on the second base substrate arranged in a direction in which emitted light from the organic light-emitting display panel is transmitted,
wherein the optical member reduces reflection of external light.

14. The organic light-emitting display apparatus of claim 13, wherein the optical member comprises a neutral density film and an anti-reflection film on the neutral density film.

15. The organic light-emitting display apparatus of claim 11, further comprising an optical member on the second base substrate arranged in a direction in which emitted light from the organic light-emitting display panel is transmitted,
wherein the optical member reduces reflection of external light.

16. The organic light-emitting display apparatus of claim 15, wherein the optical member comprises:
a polarizer having a polarizing axis; and
a retardation film between the organic light-emitting display panel and the polarizer and having a phase difference of $\frac{1}{4}\lambda$.

17. The organic light-emitting display apparatus of claim 11, wherein the light sensing unit comprises first, second, and third photo sensors.

18. An organic light-emitting display apparatus, comprising:
an organic light-emitting display panel having a display area and a non-display area adjacent the display area, the display area comprising a plurality of pixel areas, the organic light-emitting display panel comprising:
a first substrate; and
a second substrate facing the first substrate; and
a light sensing unit comprising a photo sensor facing a side of the first substrate,
wherein the first substrate comprises:
a thin film transistor comprising a semiconductor active layer, a gate electrode, a source electrode, and a drain electrode on a first base substrate;
a gate insulating layer between the semiconductor active layer and the gate electrode;
an interlayer insulating layer on the gate electrode and insulating the gate electrode, the source electrode, and the drain electrode; and
a top emission type organic light-emitting device coupled to the thin film transistor, and
wherein the second substrate comprises:
a black matrix between the plurality of pixel areas at a side of a second base substrate facing the first substrate; and
a second substrate comprising a reflective pattern on the black matrix.

19. The organic light-emitting display apparatus of claim 18, wherein the black matrix comprises at least one of a protruding portion protruding in a direction toward the first substrate and a recessed portion recessed in a direction away from the first substrate, and
wherein the reflective pattern has a shape corresponding to the protruding portion.

20. The organic light-emitting display apparatus of claim 19, wherein each of the protruding portion and the recessed portion has an inclined surface.

21. The organic light-emitting display apparatus of claim 18, wherein the reflective pattern is on a portion of the black matrix that is adjacent to the non-display area.

22. The organic light-emitting display apparatus of claim 18, wherein the second substrate comprises a plurality of color filters in spaces of the black matrix and having different colors.

23. The organic light-emitting display apparatus of claim 22, further comprising an optical member on the second base substrate arranged in a direction in which emitted light from the organic light-emitting display panel is transmitted,
wherein the optical member reduces reflection of external light.

24. The organic light-emitting display apparatus of claim 23, wherein the optical member comprises a neutral density film and an anti-reflection film on the neutral density film.

25. The organic light-emitting display apparatus of claim 18, further comprising an optical member on the second base substrate arranged in a direction in which emitted light from the organic light-emitting display panel is transmitted,
wherein the optical member reduces reflection of external light.

26. The organic light-emitting display apparatus of claim 25, wherein the optical member comprises:

a polarizer having a polarizing axis; and a retardation film between the organic light-emitting display panel and the polarizer and having a phase difference of $\frac{1}{4}\lambda$.

27. The organic light-emitting display apparatus of claim 18, wherein the light sensing unit comprises first, second, and third photo sensors, each of the first to third sensors being configured to sense light having a different color.

* * * * *